(12) United States Patent
Mitsuiki

(10) Patent No.: US 6,716,761 B2
(45) Date of Patent: Apr. 6, 2004

(54) METHOD OF FORMING FINE PATTERNS

(75) Inventor: Akira Mitsuiki, Yokohama (JP)

(73) Assignee: Semiconductor Leading Edge Technologies, Inc., Kanagawa (JP)

( * ) Notice: Subject to any disclaimer, the term of this patent is extended or adjusted under 35 U.S.C. 154(b) by 86 days.

(21) Appl. No.: 10/023,847

(22) Filed: Dec. 21, 2001

(65) Prior Publication Data

US 2002/0094688 A1 Jul. 18, 2002

(30) Foreign Application Priority Data

Jan. 16, 2001 (JP) ........................................ 2001-007539

(51) Int. Cl.[7] .............................................. H01L 21/302
(52) U.S. Cl. ........................ 438/706; 438/708; 438/709; 438/714; 438/723; 438/724
(58) Field of Search ................................ 438/694, 706, 438/708, 709, 714, 723, 724

(56) References Cited

U.S. PATENT DOCUMENTS 5,328,810 A * 7/1994 Lowrey et al. ............. 430/313
6,124,212 A * 9/2000 Fan et al. ................... 438/709
6,482,726 B1 * 11/2002 Aminpur et al. ............ 438/585

FOREIGN PATENT DOCUMENTS

| JP | 2-266517 A | 10/1990 |
| JP | 2-303022 A | 12/1990 |
| JP | 4-48729 A | 2/1992 |
| JP | 2000-58511 A | 2/2000 |
| TW | 403940 | 9/2000 |

* cited by examiner

Primary Examiner—Nadine G. Norton
Assistant Examiner—Binh X Tran
(74) Attorney, Agent, or Firm—Foley & Lardner

(57) ABSTRACT

A resist pattern is formed on a film to be processed using a lithography technique. The line width of the resist pattern is narrowed using a slimming technique. Thereafter, the pattern of a first film to be processed is formed in the space that has been widened by slimming, utilizing the phenomenon in which anisotropic etching under a reduced pressure accelerates the etching rate in the vicinity of the side of the line of the pattern compared to other areas. An underlying second film to be processed is etched using the first film to be processed as a mask. Thereby the pattern of the second film to be processed that has a pitch ½ the lithography pattern is formed.

6 Claims, 5 Drawing Sheets

METHOD OF FORMING FINE PATTERNS

BACKGROUND OF THE INVENTION

1. Field of the Invention

The present invention relates to a method of forming fine patterns of a thin film on a substrate in the process of manufacturing a semiconductor device and the like.

2. Background Art

FIGS. 1A, 1B, 1C, and 1D are diagrams showing a conventional method of forming patterns that uses a lithography technique.

As FIG. 1A shows, an oxide film 2 of a thickness of about 4 nm is formed on a semiconductor substrate 1 such as a silicon wafer. A polysilicon film 3 of a thickness of about 150 nm is formed on the oxide film 2, and an oxide film 4 of a thickness of about 200 nm is formed on the polysilicon film 3. Next, an organic anti-reflective film 6 of a thickness of about 100 nm is formed on the oxide film 4, and a resist pattern 7 of a line-and-space (hereafter referred to as L/S) of 0.16/0.16 μm is formed on the anti-reflective film 6 with lithography equipment such as an excimer laser.

Next, as FIG. 1B shows, the anti-reflective film 6 is etched with the resist pattern 7 as a mask. Etching is performed using dry etching equipment so as not to change the line width of the resist pattern 7.

Furthermore, as FIG. 1C shows, the oxide film 4 is etched using oxide-film etching equipment.

Thereafter, as FIG. 1D shows, the resist pattern 7 is removed by ashing. Then, the polysilicon film 3 is etched with silicon dry etching equipment using the oxide film 4 as a hard mask.

As obviously seen in FIG. 1D, the pattern of the polysilicon film 3 formed by the above-described process is of the L/S=0.16/0.16 μm, identical to the L/S of the resist pattern 7.

In this method, since a thin film pattern is fabricated using a resist pattern formed with a lithography technique (hereafter referred to as "lithography pattern") as a mask, a pattern finer than the lithography pattern cannot be formed.

Although a slimming technique has been known as a method of narrowing the line width, since the space width is widened as the line is narrowed, the pattern pitch does not change from the resist pattern, and the pattern does not become finer.

SUMMARY OF THE INVENTION

The object of the present invention is to provide a method of forming a fine pattern without being obstructed by the limitation of a lithography technique.

First, a resist pattern is formed using a lithography technique on a film to be processed that has been deposited on a substrate. The resist pattern is subjected to etching to narrow the line width. Next, the first film to be processed underneath the resist pattern is subjected to anisotropic etching under a reduced pressure. Etching under a reduced pressure accelerates the etching rate in the vicinity of the side of the line of the pattern compared to other areas. Therefore, when difference in the etching rates is utilized, the underlying film to be processed can be exposed in the vicinity of the side of the line of the pattern, leaving the film to be processed in other areas. This etching exposes only the vicinity of the side of the line of the resist pattern of the second film to be processed underneath the first film to be processed, and forms the pattern of the first film to be processed. Next, the second film to be processed is etched using the pattern of the first film to be processed as a mask to form the pattern of the second film to be processed. The pitch of the resulting pattern of the second film to be processed becomes ½ the pitch of the resist pattern.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

Figure 1A:
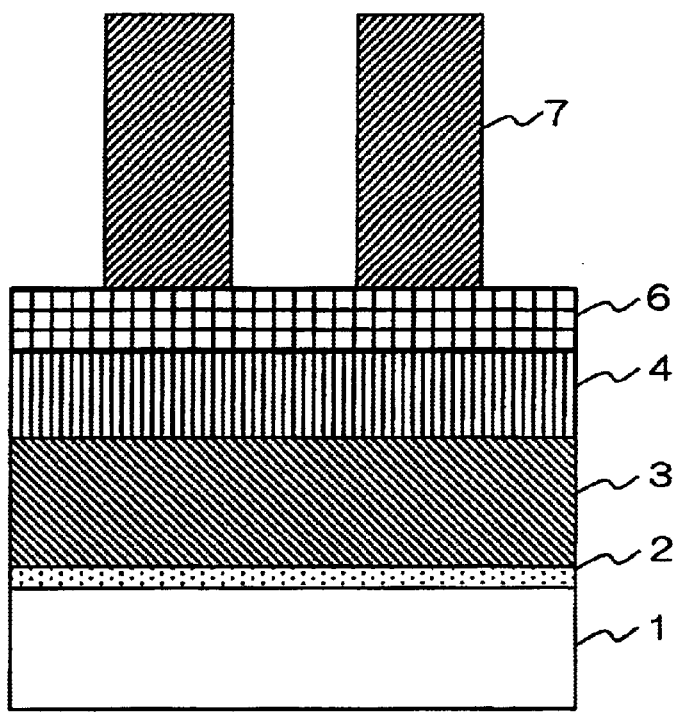
FIGS. 1A, 1B, 1C, and 1D are diagrams showing a conventional method of forming patterns.
Figure 1B:
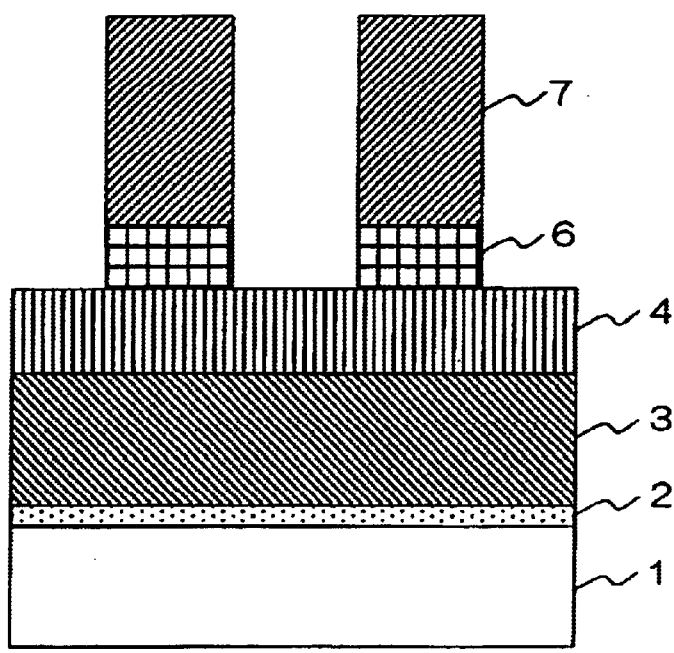
Figure 1C:
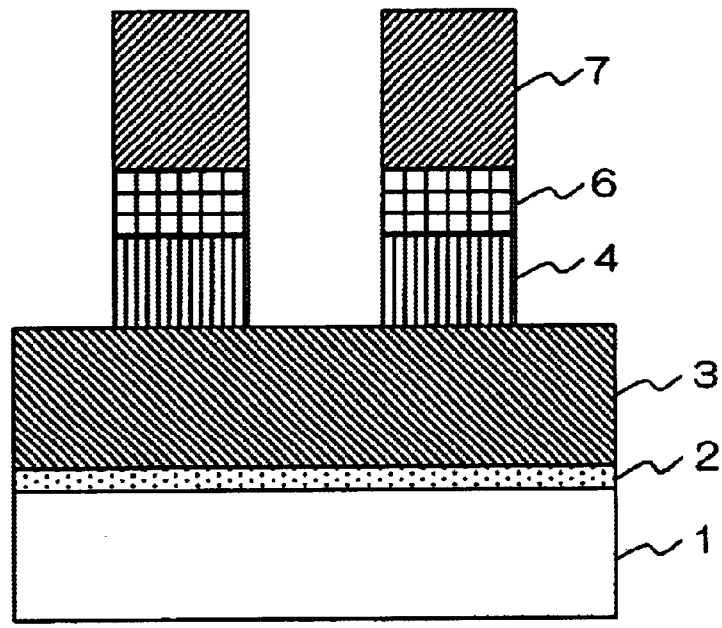
Figure 1D:
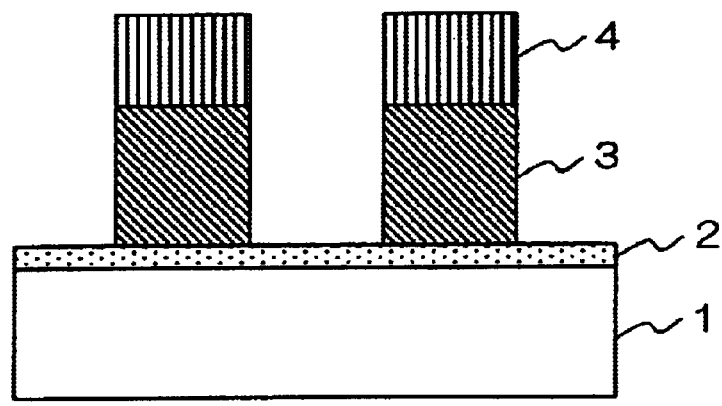
Figure 2A:
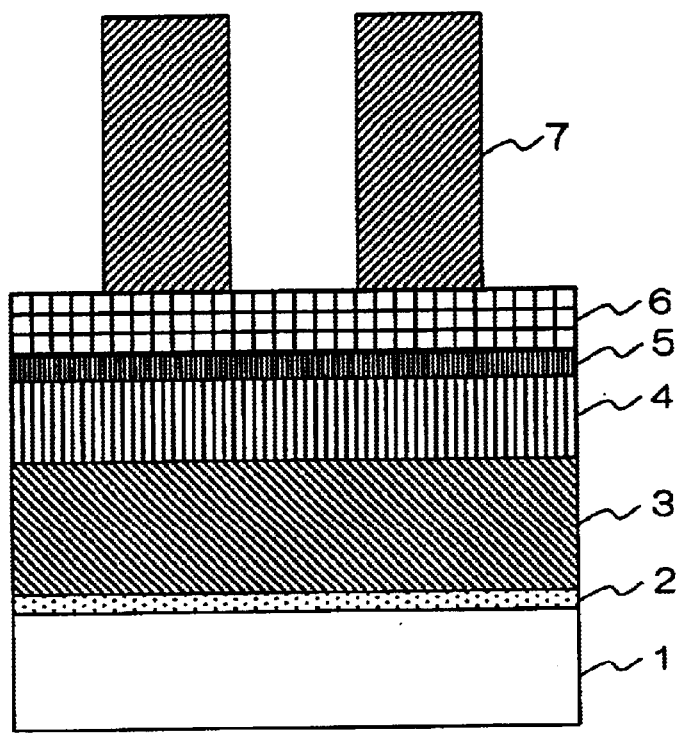
FIGS. 2A, 2B, 2C, 2D, 2E, 2F, and 2G are diagrams showing a method of forming a fine pattern according to the present invention.

First, as FIG. 2A shows, films to be processed are deposited on a semiconductor substrate 1 such as a silicon wafer. To begin with, an oxide film 2 of a thickness of about 4 nm is formed, and a polysilicon film 3 of a thickness of about 150 nm is formed on the oxide film 2. An oxide film 4 of a thickness of about 100 nm is formed on the polysilicon film 3, and a nitride film 5 of a thickness of about 30 nm is further formed on the oxide film 4. An organic anti-reflective film 6 of a thickness of about 100 nm is applied to the nitride film 5.

Here, the nitride film 5 corresponds to the above-described first film to be processed, and the oxide film 4 corresponds to the above-described second film to be processed. The polysilicon film 3 is the third film to be processed.

Next, a resist pattern 7 of an L/S of 0.16/0.16 μm is formed on the anti-reflective film 6 with lithography equipment such as an excimer laser (lithography step).

Figure 2B:
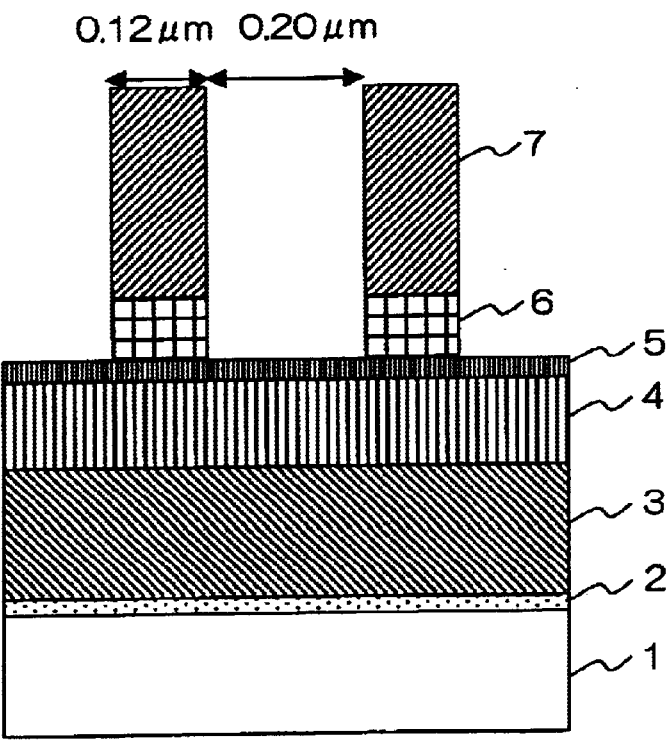
Figure 2C:
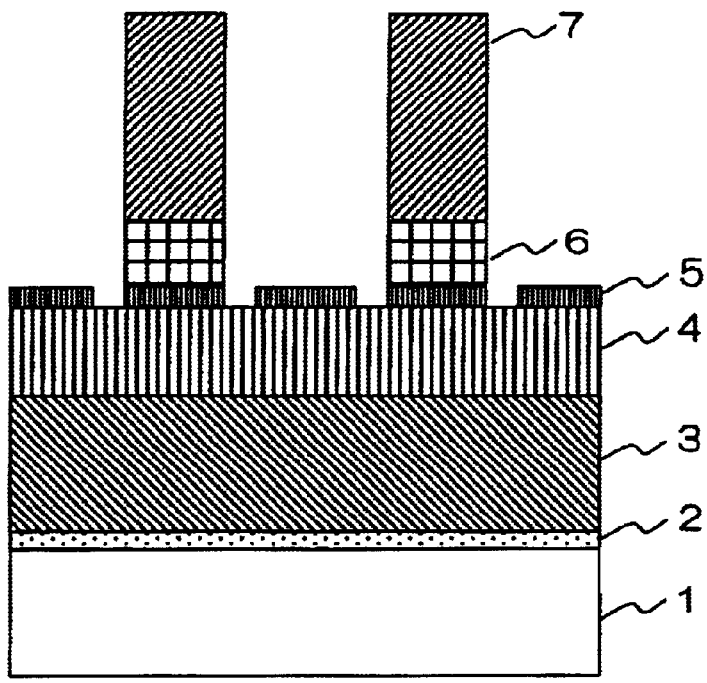

Then, as a first etching step, the resist pattern 7 is subjected to slimming. In this embodiment, dry etching equipment and resist ashing equipment are used, and a gas that contains $O_2$ is used. In this case, as FIG. 2B shows, conditions are set so that the resist pattern 7 also etched in the lateral direction, and that L/S becomes 0.12/0.20 μm. In this step, the resist pattern 7 is slimmed, and at the same time, and the anti-reflective film 6 is etched using the resist pattern 7 as a mask. In the following description, the anti-reflective film 6 is treated as a part of the resist pattern 7.

Next the second etching step will be described. The second etching step is performed using silicon dry etching equipment of for example an ECR type, under the following conditions.

[Etching Conditions]

Pressure: 1 Pa, Microwave Power: 800 W, Bias Power: 200 W, Process Gas: $Cl_2$: 200 sccm In dry etching under such a low pressure, the etching rate in the vicinity of the side of the pattern is higher than the etching rate in other portions. As a result, the underlying oxide film 4 is exposed only in the vicinity of the side of the pattern, and a new mask pattern of the nitride film 5 can be formed in the area that was a space in the resist pattern 7.

It is preferable that etching is conducted so as to equalize the widths of the area where the nitride film 5 remains, that is, the area to be the mask in the third etching step described below, with the widths of the resist pattern 7, regardless of the presence or absence of the upper-layer resist. In the embodiment, since the L/S of the resist pattern 7 is made 0.12/0.20 µm by the first etching step (FIG. 2B), if the width of the opened area of the nitride film 5, that is, the area to expose the oxide film 4 by etching is 0.04 µm, the line width of the pattern of the newly formed nitride film 5 becomes 0.12 µm, which equals to the line width of the resist pattern.

As a third etching step after removing the resist pattern 7 (including the anti-reflective film 6) by ashing, the oxide film 4 is subjected to dry etching and wet etching using the nitride film 5 as a mask to form the pattern of the oxide film 4.

Figure 2D:
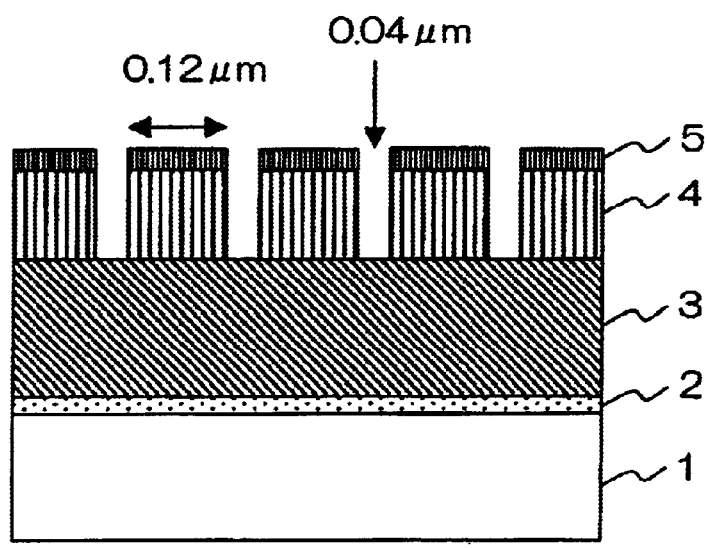
Figure 2E:
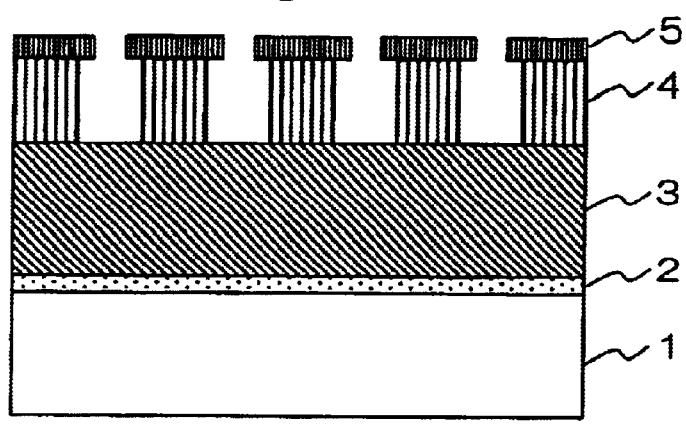

FIG. 2D is a diagram showing the pattern of the oxide film 4 formed by dry etching. At this time the pattern with a pitch of a half the pitch of the resist pattern 7 can be obtained. Also, the L/S of the pattern obtained by the third etching step becomes 0.12/0.04 µm, while the L/S of the resist pattern 7 was 0.16/0.16 µm.

Next, wet etching is conducted so that the L/S becomes a desired L/S within a range between 0.12/0.04 µm and 0.04/0.12 µm. However, dry etching may also be used if it is isotropic.

Figure 2F:
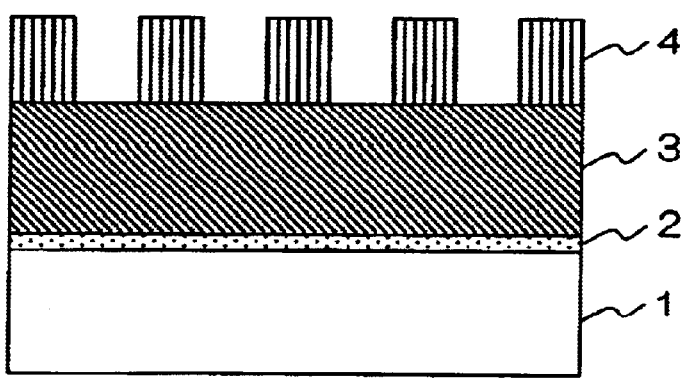

In the case of oxide-film etching, since the nitride film 5 on the upper surface of the oxide film 4 is not etched, and the width of the nitride film 5 is unchanged, the nitride film 5 is then removed by nitride-film etching (FIG. 2F).

Figure 2G:
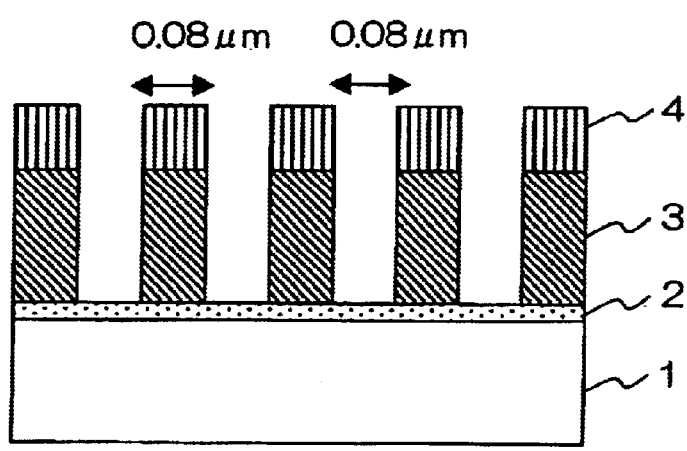

In a fourth etching step, the polysilicon film 3 is etched using the pattern of the oxide film 4. FIG. 2G shows the structure finally obtained when etching is conducted so that the L/S of the pattern of the oxide film 4 becomes 0.08/0.08 µm in the above-described third etching step. In this case, the obtained pattern has the pitch, line width and space of a half the pitch, line width and space of the resist pattern 7.

By forming gate electrodes from the pattern formed as described above and forming a source/drain region on the semiconductor substrate 1 by the ordinary process, a semiconductor device of a higher density than conventional semiconductor devices can be manufactured.

To summarize, the method of this embodiment is a method of forming a fine pattern that has a pitch half the pitch of a lithography pattern, by narrowing the line width of the resist pattern by slimming in the first etching step; forming a new mask pattern in the space widened by slimming in the second etching step; and etching the underlying layer using the mask pattern in the third etching step.

The reason why wet etching is conducted as well as dry etching in the third etching step is that since etching is conducted in the second etching step utilizing difference in etching rate in a reduced-pressure environment, it is difficult to form the pattern of the desired size. For example, if the etching time is increased to reduce the line width, the portion to be left as a line is etched, and the required thickness cannot be secured. Therefore, a desired line width is obtained by isotropic etching in the third etching step. However, even if isotropic etching is not conducted, the pattern pitch can be made half the pitch of the lithography pattern; therefore, isotropic etching is not essential in the present invention.

Although desired line widths and space widths can be obtained when isotropic etching in the third etching step is conducted, the shape of the obtained pattern is not always suitable to form the components of the semiconductor device (e.g., the gate electrode). In this embodiment, therefore, anisotropic etching is further conducted also using the pattern obtained by the isotropic etching as a mask (the fourth etching step) to obtain the pattern of the desired shape that has the pitch of half the pitch of the lithography pattern, and desired line widths and space widths. However, the fourth etching step is only-preferable to adjust the shape of the pattern, and is not essential in the present invention.

Although the materials for the film to be processed is not specifically limited in the method of the present invention, since the underlying film to be processed is etched using the pattern of upper-layer film to be processed as a mask in each etching step, the combination of film materials having corresponding etching selectivity. For example, in the third etching step, since the second film to be processed is etched using the pattern of the first film to be processed as the mask, it is required, also considering the combination with the etching gas, to select a combination in which the etching rate of the second film to be processed is higher than the etching rate of the first film to be processed, and preferably, the rate ratio is as large as possible.

Although a silicon substrate is used as the semiconductor substrate 1, silicon oxide films are used as the oxide film 2 and the oxide film 4, and a silicon nitride film is used as the nitride film 5, the materials for the substrate and films may be other materials as far as the above-described requirements for etching rates are satisfied. Since the oxide film 4 and the nitride film 5 are not necessarily required to be the oxide film and the nitride film of the semiconductor substrate, the oxide film 4 and the nitride film 5 are not limited to a silicon oxide film and a silicon nitride film, respectively, even if the semiconductor substrate is a silicon substrate.

In this embodiment, although the finally formed pattern is the pattern of the polysilicon film 3, the conductive film is not limited to a polysilicon film, but tungsten film, tungsten silicide film, or the like may be used.

The method of the present invention can be applied not only to the case where a gate electrode and the like disposed on a substrate is formed, but also to the case where a wiring pattern disposed in an interlayer insulating film is formed. The method of the present invention is not limited to the formation of a conductive film pattern, but is applicable to the formation of an insulating film pattern.

It is further understood that the foregoing description is a preferred embodiment of the disclosed apparatus and that various changes and modifications may be made in the invention without departing from the spirit and scope thereof.

The entire disclosure of a Japanese Patent Application No.2001-007539, filed on Jan. 16, 2001 including specification, claims drawings and summary, on which the Convention priority of the present application is based, are incorporated herein by reference in its entirety.

What is claimed is:

1. A method of forming a fine pattern, comprising:
   a lithography step for forming a resist pattern on a film to be processed deposited on a substrate using a lithography technique,
   a first etching step for etching said resist pattern to narrow the line width of said resist pattern,
   a second etching step for performing anisotropic etching to a first film to be processed underneath said resist pattern, under a reduced pressure environment where the etching rate of an exposed area of the first film in the vicinity of the side of said resist pattern is higher than the etching rate of other exposed areas of the first film, to expose a second film to be processed underneath said first film to be processed in the vicinity of the side of the line of said resist pattern, and to form the pattern of said first film to be processed, and a third etching step for etching said second film to be processed using the pattern of said first film to be processed as a mask, to form a pattern of a pitch of ½ the pitch of said resist pattern on said second film to be processed.

2. The method of forming a fine pattern according to claim 1, wherein said reduced pressure environment is an environment where the pressure of the etching gas is 1.5 Pa or below.

3. The method of forming a fine pattern according to claim 1, wherein said first film to be processed is a nitride film, and said second film to be processed is an oxide film.

4. The method of forming a fine pattern according to claim 1, wherein said third etching step is a step for performing anisotropic etching to said second film to be processed using the pattern of said first film to be processed as a mask, then performing isotropic etching to obtain a pattern of a desired line width and space width.

5. The method of forming a fine pattern according to claim 1, further comprising a fourth etching step, wherein anisotropic etching is preformed to said third film to be processed underneath said second film to be processed using the pattern obtained by said third etching step as a mask, to form a desired line width and space width on said third film to be processed.

6. A method of manufacturing a semiconductor device comprising steps for forming a fine pattern using the method of forming a fine pattern according to claim 1.

* * * * *